(12) United States Patent
Chemisky et al.

(10) Patent No.: US 7,034,436 B2
(45) Date of Patent: Apr. 25, 2006

(54) DEVICE TO CONTROL A PIEZOELECTRIC ACTUATOR

(75) Inventors: Eric Chemisky, Lauterbourg (FR); Walter Schrod, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 13 days.

(21) Appl. No.: 10/667,777

(22) Filed: Sep. 22, 2003

(65) Prior Publication Data

US 2004/0195936 A1 Oct. 7, 2004

Related U.S. Application Data

(63) Continuation of application No. PCT/DE02/01029, filed on Mar. 21, 2002.

(30) Foreign Application Priority Data

Mar. 21, 2001 (DE) ................. 101 13 802

(51) Int. Cl.
*H01L 41/08* (2006.01)

(52) U.S. Cl. ................. 310/315; 310/316.03

(58) Field of Classification Search ............ 310/314, 310/315, 316.01, 316.03, 317
See application file for complete search history.

(56) References Cited

U.S. PATENT DOCUMENTS

| | | | | |
|---|---|---|---|---|
| 4,608,506 A | * | 8/1986 | Tanuma | 310/315 |
| 4,632,311 A | * | 12/1986 | Nakane et al. | 239/101 |
| 5,387,832 A | * | 2/1995 | Tanaka et al. | 310/249 |
| 5,387,834 A | * | 2/1995 | Suzuki | 310/317 |
| 5,479,062 A | | 12/1995 | Yoshino | 310/316 |
| 5,517,073 A | * | 5/1996 | Ohkuma | 310/315 |
| 5,517,845 A | | 5/1996 | Yamashita et al. | 73/1 |
| 5,659,270 A | * | 8/1997 | Millen et al. | 331/69 |
| 5,987,992 A | * | 11/1999 | Watanabe et al. | 73/632 |
| 6,198,199 B1 | | 3/2001 | Hoffmann et al. | 310/316.03 |
| 6,441,535 B1 | | 8/2002 | Freudenberg et al. | 310/316.03 |
| 6,661,155 B1 | | 12/2003 | Schrod | 310/316.01 |
| 2002/0046731 A1 | | 4/2002 | Rueger et al. | 123/299 |
| 2005/0057118 A1 | | 3/2005 | Chemisky et al. | 310/314 |

FOREIGN PATENT DOCUMENTS

| | | |
|---|---|---|
| DE | 35 38 964 A1 | 5/1987 |
| DE | 19632872 A1 | 2/1998 |
| DE | 196 52 801 C1 | 4/1998 |
| DE | 19652801 C1 | 4/1998 |
| DE | 198 08 994 A1 | 10/1998 |
| DE | 19714607 A1 | 10/1998 |
| DE | 19805184 A1 | 8/1999 |
| DE | 19854789 A1 | 8/1999 |

(Continued)

OTHER PUBLICATIONS

International PCT Search Report for application No. PCT/DE03/01613, 7 pages.

(Continued)

*Primary Examiner*—Mark Budd
(74) *Attorney, Agent, or Firm*—Baker Botts L.L.P.

(57) ABSTRACT

A device for controlling a piezoelectric actuator (Cp), in particular for a fuel-injection valve of an internal combustion engine, comprises an energy source (EQ), which supplies the actuator (Cp) with energy (E0), whereby the extension of the piezoelectric actuator (Cp) corresponds with a predetermined response to changes in temperature. A compensation capacitor (C0) is connected in parallel to the piezoelectric actuator (Cp). The capacitance of said capacitor is calculated in such a way that the extension (Cp) of the actuator remains approximately constant over the temperature range, when supplied with a constant amount of energy (E0) by the energy source (EQ).

14 Claims, 4 Drawing Sheets

FOREIGN PATENT DOCUMENTS

| | | |
|---|---|---|
| DE | 19845042 C2 | 4/2000 |
| DE | 199 10 388 A1 | 9/2000 |
| DE | 199 31 233 A1 | 1/2001 |
| DE | 19931235 C2 | 1/2001 |
| DE | 19944733 A1 | 3/2001 |
| DE | 100 38 995 A1 | 4/2001 |
| DE | 19944734 A1 | 4/2001 |
| EP | 1138903 A1 | 4/2000 |
| EP | 1138915 A1 | 4/2000 |
| EP | 1139446 A1 | 4/2000 |
| EP | 1 172 541 A1 | 7/2000 |
| JP | 02286852 | 11/1990 |
| JP | 05284600 | 10/1993 |
| WO | WO 98/27600 | 6/1998 |
| WO | 01/77510 A1 | 10/2001 |
| WO | 03/027468 A1 | 4/2003 |
| WO | 03/100235 | 12/2003 |

OTHER PUBLICATIONS

International PCT Search Report for application No. PCT/DE02/01029, 7 pages.

* cited by examiner

DEVICE TO CONTROL A PIEZOELECTRIC ACTUATOR

CROSS REFERENCE TO RELATED APPLICATION

This application is a continuation of copending International Application No. PCT/DEO2/01029 filed Mar. 21, 2002 which designates the United States, and claims priority to German application number 10113802.4 filed Mar. 21, 2001.

TECHNICAL FIELD OF THE INVENTION

The invention relates to a device for controlling a piezoelectric actuator, in particular a fuel injection valve of an internal combustion engine, comprising an energy source which supplies the actuator with energy, whereby the extension of the piezoelectric actuator corresponds with a predetermined response to changes in temperature.

BACKGROUND OF THE INVENTION

A device of this type is known from DE 196 52 801 C1. The energy source in this invention supplies the piezoelectric actuator with a specified amount of energy for which the value is derived from a temperature-dependent key field.

The speed and stability of piezoelectrically controlled injection valves for internal combustion engines, both for petrol and also for diesel applications, has made them ever more attractive to auto makers. However the reproducibility of the amount of fuel injected depends directly on the precision of the movements of the valve needle. Since the needle is driven directly by a piezoelectric actuator via a movement converter or a servo valve in the diesel area it is necessary to control this actuator across the entire temperature range electrically with the appropriate precision.

DE 196 52 801 C1 proposes supplying the piezoelectric actuators with constant energy, with the value of the energy to be actually fed being obtained from the measured temperature from a key field and the charge voltage being subject to regulation to arrive at the desired amount of energy.

Controlling a typical piezoelectrically operated injection valve with constant energy however means that it looses around a 15% extension in the temperature range from 0° C. to 125° C. in accordance with FIG. 2. It would now be possible to regulate the energy here too through a corresponding key field to a larger amount of energy at higher temperatures, to compensate for the loss of extension. This is however only possible if in the final stage there is sufficiently large computing power available and when the energy feed to the actuator can be measured within the device.

SUMMARY OF THE INVENTION

The object of the present invention is, thus, to develop a device in accordance with the generic model in a simple way so as to achieve better compensation for needle extension losses.

The object can be achieved by a device for controlling a piezoelectric actuator, in particular a fuel injection valve of an internal combustion engine, comprising an energy source which supplies the actuator with energy, whereby the extension of the piezoelectric actuator corresponds with a predetermined response to changes in temperature, and a compensation capacitor which is connected in parallel with the piezoelectric actuator for which the capacitance is dimensioned in such a way that, for a constant amount of energy delivered by the energy source the extension of the actuator is almost constant across the temperature range.

The energy source, a controller controlling the energy source and a compensation capacitor can be accommodated in a housing and are connected via a cable with the piezoelectric actuator. The energy source, a control circuit controlling the energy source, the compensation capacitor, and the piezoelectric actuator can also be accommodated in a housing, whereby the control circuit can be controlled by an external controller. The compensation capacitor may have a capacitances of around 10.5 µF. The housing can be a fuel injection valve housing. The device may further comprise a temperature sensor coupled with the external controller for determining the temperature of the housing. The device may also comprise a measurement line coupled with the controller and the actuator used to determine the voltage at the actuator. The device may further comprise a temperature sensor coupled with the actuator and electrically coupled with a measurement line used to transmit the temperature value of the actuator to the controller.

The object can also be achieved by a method for controlling a piezoelectric actuator, in particular a fuel injection valve of an internal combustion engine, comprising the steps of:

supplying the actuator with energy, whereby the extension of the piezoelectric actuator corresponds with a predetermined response to changes in temperature, and compensating the extension of the piezoelectric actuator by means of capacitor coupled in parallel with the actuator, wherein the capacitance is dimensioned in such a way that, for a constant amount of energy delivered by the energy source the extension of the actuator is almost constant across the temperature range.

The method may further comprise the step of sensing the voltage of the actuator and/or the step of sensing the temperature of the actuator.

Accordingly the device is designed in such a way that a compensation capacitor is connected in parallel with the piezoelectric actuator with capacitance is dimensioned in such a way that for a constant amount of energy supplied by the energy source the expansion of the actuator is almost constant over the temperature range.

The capacitance of the piezoelectric actuator increases as the temperature rises, whereas the capacitance of the compensation capacitor remains more or less constant. The result is that, as the temperature increases, an increasing share of the constant amount of energy delivered by the energy source is stored in the piezoelectric actuator so that the loss of extension can be almost entirely compensated for with suitable dimensioning of the compensation capacitor. In line with the invention no expensive regulation is needed here but merely a further component that must be suitably dimensioned.

The device in accordance with the invention to control a piezoelectric actuator can be used in a conventional manner in an internal combustion engine, whereby the piezoelectric actuator is deigned as a unit with the fuel injection valve and is connected by a cable to a controller containing both the energy source with the downstream compensation capacitor and also a control circuit to control the energy source.

The device in accordance with the invention can however be used particularly advantageously in an "intelligent" fuel injection valve, since here not only the piezoelectric actuator is designed as a unit with the injection valve but also the energy source as well as a simple controller are arranged in this unit. In an advantageous embodiment of the invention the compensation capacitor is also located in this unit and allows a particularly simple compensation for expansion losses here, provided the controller unit has sufficient computing power for the effort of regulation and a precise measurement of the actuator temperature is possible.

BRIEF DESCRIPTION OF THE DRAWINGS

The invention is explained below in more detail with the aid of figures. The figures show.

DETAILED DESCRIPTION OF THE PREFERRED EMBODIMENTS

Figure 1:
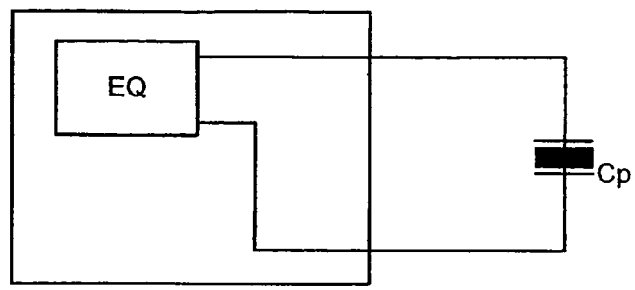
FIG. 1 a basic circuit diagram of a device for controlling a piezoelectric actuator in accordance with the prior art, FIG. 2 the graph for an actuator expansion across the range of temperatures with a constant energy feed, FIG. 3a basic circuit diagram of a device for controlling a piezoelectric actuator in accordance with the invention, FIG. 4 the graph of the energy fed into an actuator in accordance with the prior art and in accordance with the invention, FIG. 5 a first use of the invention and FIG. 6 a second use of the invention

FIG. 1 shows a device for controlling a piezoelectric actuator for a fuel injection valve as is normal in the prior art. An actuator Cp is supplied by an energy source EQ with a constant amount of energy Eo.

Figure 2:
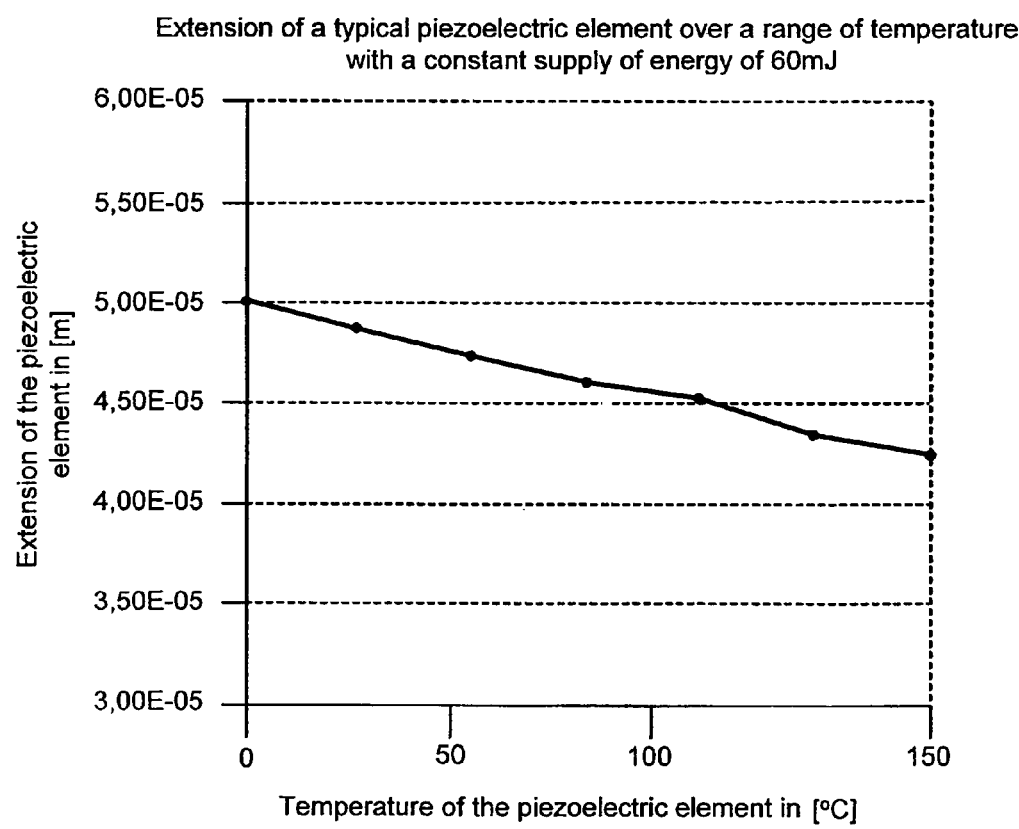

FIG. 2 shows the graph of the expansion of a piezoelectric actuator depending on the temperature of the actuator when a constant amount of energy of 60 mJ is applied. As can be seen, in the temperature range of 0° C. to 125° C. the actuator loses appr. 15% extension which must be compensated for where possible to ensure that the desired amount of fuel is really injected when the actuator is used in a fuel injection valve.

Figure 3:
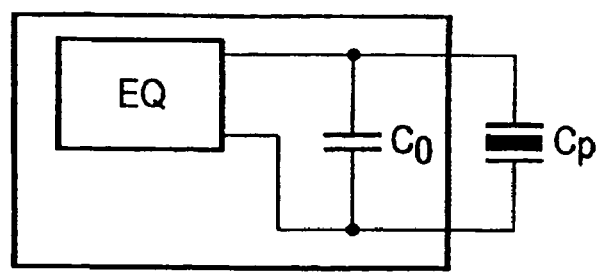

FIG. 3 shows a basic circuit diagram of a device in accordance with the invention. Unlike the circuit shown in FIG. 1 a compensation capacitor Co is connected in parallel with the piezoelectric actuator Cp, whereby both capacitors are supplied by the energy source with a constant amount of energy Eo. In this case an amount of energy is allotted to the actuator.

$$Ep = E_0 * \frac{Cp/Co}{1 + Cp/Co}$$

Figure 4:
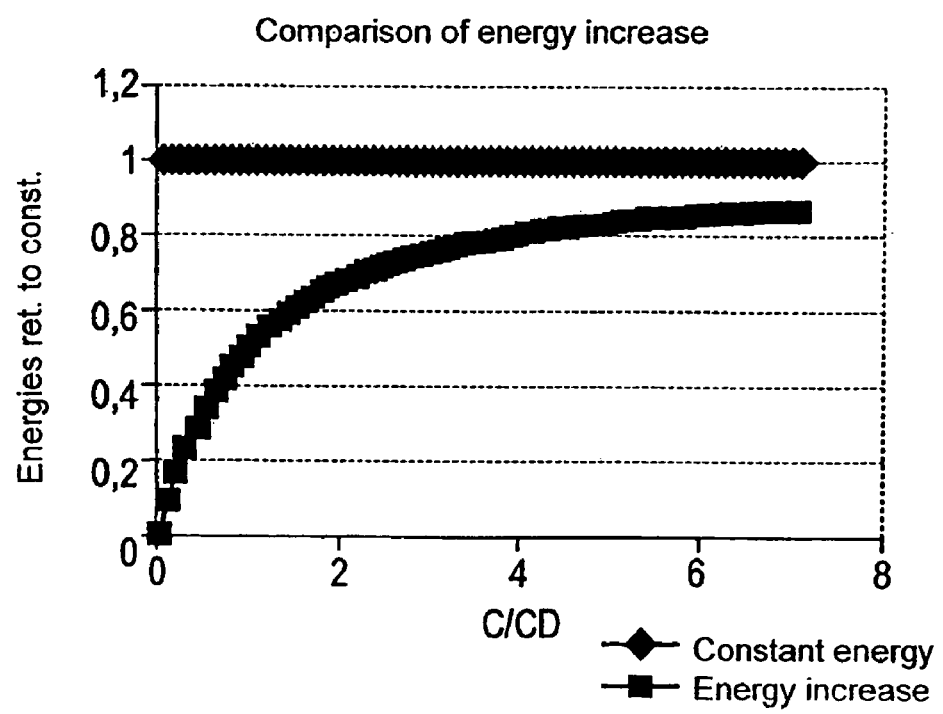

The graph of the amount of energy Ep allotted to the actuator as a function of the ratio of the capacitance of the actuator to the capacitance of the compensation capacitor Cp/Co is shown in FIG. 4. The figure also shows the graph of the amount of energy for a circuit in accordance with FIG. 1.

As can be seen from the graph of the above function, the energy Ep stored in a piezoelectric actuator increases as the actuator capacitance Cp increases and thereby with increasing temperature so that the loss of extension can be compensated for.

Figure 5:
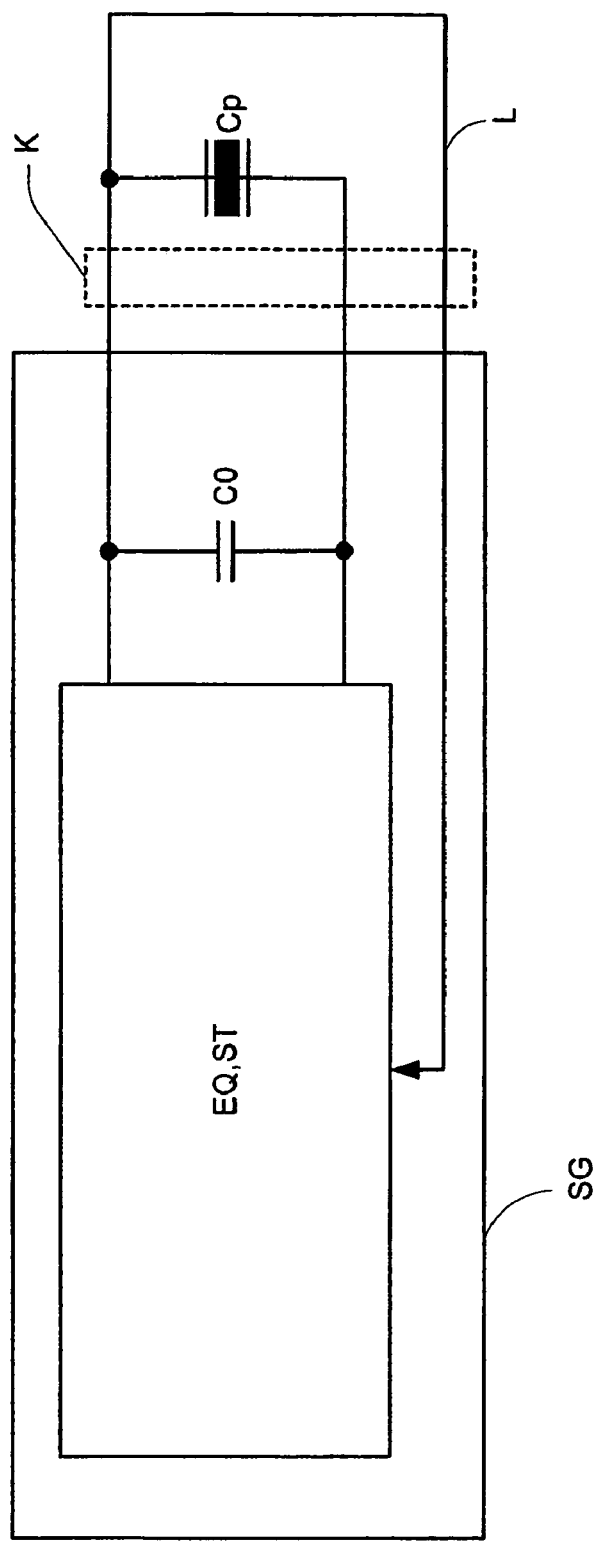

Normal control circuits for piezoelectric actuators contain an energy source EQ, a control circuit ST to control the energy source EQ in a controller SG which is connected via a cable K with the piezoelectric actuator Cp or is linked to a fuel injection valve containing the actuator Cp. When a device in accordance with the invention is used to control a piezoelectric actuator, the compensation capacitor Co is also located in the controller SG, as shown in FIG. 5. Measurement line L can be used to transfer the voltage at the actuator Cp or its temperature to the control circuit, in order to be able to regulate the extension for example. Although in such normal control circuits there is mostly already a capacitor at the output of energy source EQ this is there exclusively to comply with EMC guidelines. The capacitance of such capacitors is around 2 µF. For compensation of temperature-related loss of extension in accordance with the invention, the piezoelectric actuators normal today, such as those produced by EPCOS with external dimensions of 5×5, 5×40, 5 mm, a layer thickness of 80 µm and SiPd contacting, need capacitances of around 10.5 µF.

A particularly advantageous use of the device in accordance with the invention presents itself with so-called "intelligent" fuel injection valves in which the piezoelectric actuator Cp, an energy source EQ and a control circuit ST as well as the compensation capacitor Co in accordance with the invention are accommodated in the fuel injection valve housing. This is basically shown in FIG. 6.

This figure also shows a measurement line L which is not however connected to the actuator itself for this version but merely to the housing of the fuel injection valve of which the temperature is measured.

Figure 6:
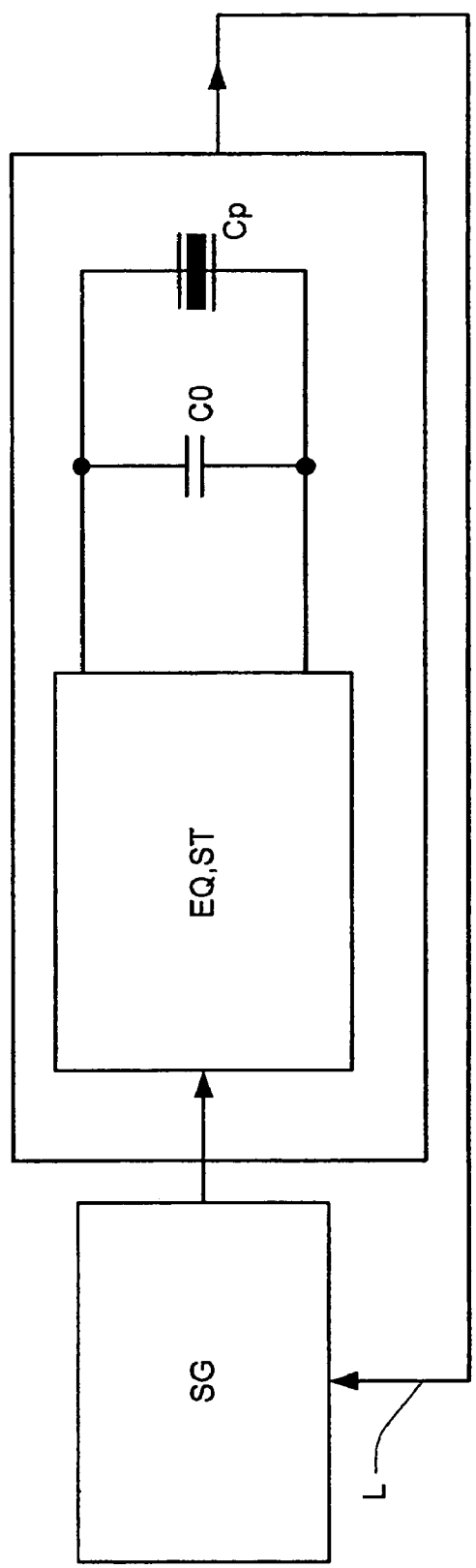

FIG. 6 also shows the controller SG to which on one side the signal on the measurement line L for processing is applied and on the other side can control the "intelligent" fuel injection valve with control signals.

The invention claimed is:

1. A device for controlling a piezoelectric actuator for use in a fuel injection valve of an internal combustion engine, said device comprising:
   an energy source to supply energy to the actuator,
   a controller for controlling the energy source,
   a measurement line coupled with the controller and actuator to determine a voltage at the actuator, and
   a compensation capacitor connected in parallel with the actuator having a capacitance such that for a constant amount of energy delivered by the energy source, an extension of the actuator is almost constant across a temperature range, wherein the energy source, the controller, and the capacitor are accommodated in a housing and connected via a cable with the actuator.

2. A method for controlling a piezoelectric actuator for use in fuel injection valve of an internal combustion engine, said method comprising the steps:
   supplying the actuator with energy, wherein an extention of the actuator corresponds with a predetermined response to changes in temperature,
   compensating the extension of the actuator via a capacitor coupled in parallel with the actuator, said capacitor having a capacitance wherein for a constant amount of energy delivered by an energy source, the extension of the actuator is almost constant across a temperature range, and
   sensing the voltage of the actuator.

3. A fuel injection valve comprising:
   a piezoelectric actuator,
   an energy source to supply the actuator with energy, wherein an extension of the actuator corresponds with a predetermined response to changes in temperature,
   a controller for controlling the energy source,
   a compensation capacitor connected in parallel with the actuator having a capacitance such that for a constant amount of energy delivered by the energy source, extension of the actuator is almost constant across a temperature range, and a measurement line coupled with the actuator used to determine the voltage at the actuator, wherein the energy source, the controller, and the capacitor are accommodated in a housing and connected via a cable with the actuator.

4. A device in accordance with claim 1, wherein the energy source, a control circuit controlling the energy source, the compensation capacitor, and the piezoelectric actuator are accommodated in a housing, whereby the control circuit can be controlled by an external controller.

5. A device in accordance with claim 1, wherein the compensation capacitor has a capacitances of around 10,5 µF.

6. A device according to claim 4, wherein the housing is a fuel injection valve housing.

7. A device according to claim 4, further comprising a temperature sensor coupled with the external controller for determining the temperature of the housing.

8. A device according to claim 1, further comprising a temperature sensor coupled with the actuator and electrically coupled with a measurement line used to transmit the temperature value of the actuator to the controller.

9. A method according to claim 2, further comprising the step of sensing the temperature of the actuator.

10. A valve in accordance with claim 3, wherein the energy source, a control circuit controlling the energy source, the compensation capacitor, and the piezoelectric actuator are accommodated in a housing, whereby the control circuit can be controlled by an external controller.

11. A valve in accordance with claim 3, wherein the compensation capacitor has a capacitances of around 10,5 µF.

12. A valve according to claim 10, wherein the housing is the housing of the fuel injection valve.

13. A valve according to claim 10, further comprising a temperature sensor coupled with the external controller for determining the temperature of the housing.

14. The valve according to claim 3, further comprising a temperature sensor coupled with the actuator and electrically coupled with a measurement line used to transmit the temperature value of the actuator to the controller.

* * * * *